United States Patent
Roh et al.

(10) Patent No.: US 7,091,751 B2
(45) Date of Patent: Aug. 15, 2006

(54) LOW-POWER AND LOW-NOISE COMPARATOR HAVING INVERTER WITH DECREASED PEAK CURRENT

(75) Inventors: Jae-Seob Roh, Anyang-si (KR); Jung-Hyun Nam, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 8 days.

(21) Appl. No.: 10/870,313

(22) Filed: Jun. 17, 2004

(65) Prior Publication Data

US 2004/0257128 A1    Dec. 23, 2004

(30) Foreign Application Priority Data

Jun. 19, 2003    (KR) ...................... 10-2003-0039903

(51) Int. Cl.
*H03K 17/00* (2006.01)
(52) U.S. Cl. .................... 327/94; 327/97; 327/436
(58) Field of Classification Search ................... None
See application file for complete search history.

(56) References Cited

U.S. PATENT DOCUMENTS

| | | | | | |
|---|---|---|---|---|---|
| 4,255,723 | A | * | 3/1981 | Ebihara | 331/116 FE |
| 4,633,101 | A | * | 12/1986 | Masuda et al. | 327/93 |
| 4,833,342 | A | * | 5/1989 | Kiryu et al. | 327/541 |
| 5,120,996 | A | * | 6/1992 | Mead et al. | 327/94 |
| 5,365,123 | A | * | 11/1994 | Nakase et al. | 326/109 |
| 5,751,142 | A | * | 5/1998 | Dosho et al. | 323/316 |
| 5,828,611 | A | * | 10/1998 | Kaneko et al. | 365/203 |
| 6,107,828 | A | * | 8/2000 | Kimura | 326/49 |
| 6,323,712 | B1 | * | 11/2001 | Shih | 327/276 |
| 6,750,676 | B1 | * | 6/2004 | Honda | 326/81 |
| 2002/0159611 | A1 | | 10/2002 | Cromer | 381/303 |
| 2003/0031333 | A1 | | 2/2003 | Cihen et al | 381/303 |
| 2003/0043051 | A1 | | 3/2003 | Shiraishi | 340/825.25 |

FOREIGN PATENT DOCUMENTS

| | | |
|---|---|---|
| DE | 26 18 381 A1 | 11/1977 |
| DE | 42 24 338 A1 | 1/1993 |
| EP | 43 07 490 A1 | 9/1994 |
| EP | 2003-125480 | 4/2003 |
| JP | 8111639 | 4/1996 |
| JP | 8-179786 | 7/1996 |
| KR | 0004718 | 6/1993 |

OTHER PUBLICATIONS

English Abstract*** (Korean Patent Abstract for Publication No. P1993-0004718).
English Abstract*** (Patent Abstract of Japan for Publication No. 08-111639).
English translation for Publication No. 2003-125480.
English translation for Publication No. 8-179-786.

* cited by examiner

*Primary Examiner*—Timothy P. Callahan
*Assistant Examiner*—An T. Luu
(74) *Attorney, Agent, or Firm*—F. Chau & Associates LLC

(57) ABSTRACT

Low-power and low-noise CDS (correlated double sampling) comparators for use with a CIS (CMOS image sensor) device are provided. A CDS comparator is constructed using one of various low-power inverters that provide decreased instantaneous transition currents at a logic threshold voltage. The use of such low-power inverters in CDS comparators enables a significant reduction in power consumption and noise in the CIS device, or other devices that implement such CDS comparators and/or inverters.

10 Claims, 9 Drawing Sheets

LOW-POWER AND LOW-NOISE COMPARATOR HAVING INVERTER WITH DECREASED PEAK CURRENT

CROSS-REFERENCE TO RELATED APPLICATION

This application claims priority to Korean Patent Application No. 2003-39903, filed on Jun. 19, 2003, in the Korean Intellectual Property Office, which is fully incorporated herein by reference.

TECHNICAL FIELD OF THE INVENTION

The present invention relates to a comparators that are used in ADC (analog-to-digital converter) circuits, and more specifically to low noise, low power CDS (correlated double sampling) comparators that are used in ADC circuits of CIS (CMOS Image Sensor) devices, wherein the comparators are designed using inverters that provide reduced peak transition currents, thereby reducing power consumption.

BACKGROUND

Typically, CIS devices are mounted in mobile phone cameras, digital cameras, etc, and include an array of active pixel sensors and driving circuitry for electronically capturing images, converting the images into electrical signals, and transmitting the electrical signals to a display driver. Typically, the driving circuitry comprises a ramp comparison type column ADC circuit structure. FIG. 1 is a block diagram illustrating a CIS device (10) having a well-known architecture comprising a pixel array (11), a ramp signal generator (12), a plurality of comparators (13), a counter (14) and a plurality of latches (15).

As is known in the art, the pixel array (11) captures an image. The comparators (13), which are employed in CDS circuits, receive analog signals output from the pixel array (11) and compare the analog signals to a ramp signal VRAMP (which is incremented with a predetermined slope) output from the ramp signal generator (12) to digitize the analog signals. The comparators (13) output digital values having a logic high state or a logic low state at timings that are different from each other. When the comparators (13) output digital values at timings that are different from each other, the counter (14) outputs counter values corresponding to timings at which the digital values are varied. The latches (15) store and output digital signals (D1, D2, . . . , DN), which are proportional to the analog signals output from the pixel array (11). The output digital signals (D1, D2, . . . , DN) are processed and input to a predetermined display device to display the photographed image.

In the conventional CIS device (10) of FIG. 1, a ramp comparison type column ADC employs as many comparators as there are columns in the pixel array (11). For example, in the CIS pixel array (11) having 380,000 pixels, the total number of effective columns amounts to about 640. To compare the ramp signal VRAMP with the analog signals output from the pixel array (11) and generate digital signals, the comparators (13) use a conventional inverter circuit (30), such as depicted in FIG. 14, consisting of one PMOSFET (p-type metal oxide semiconductor field effect transistor) (M1) and one NMOSFET (n-type metal oxide semiconductor field effect transistor) (M2), connected in series between VDD and VSS source voltages.

With the conventional inverter (30) architecture, an instantaneous transition current (a peak current) is generated at an input voltage VIN between a first logic state "0" and a second logic state "1", that is, a logic threshold voltage (for example, ½ of VDD), which disadvantageously results in a significant consumption of power. Indeed, assuming a light signal of the same high intensity is applied to all 380,000 pixels in the pixel array (11) of the CIS device (10) of FIG. 1 and signal conversions are simultaneously performed in all of about 640 columns, the instantaneous current at the logic threshold voltage would reach several hundreds mA. The generation of such a large current results in a large power consumption and the current spike influences power supply lines connected to the entire circuit producing noise components in output images or other circuit elements, thereby causing erroneous operation.

SUMMARY OF THE INVENTION

Exemplary embodiments of the invention generally include low-power and low-noise CDS (correlated double sampling) comparators for use with a CIS (CMOS image sensor) device. The CDS comparators are constructed using low-power inverters that provide decreased instantaneous transition currents at a logic threshold voltage.

More specifically, in one exemplary embodiment of the invention, a low power inverter (which can be implemented for a CDS comparator) comprises an input terminal and an output terminal, a PMOSFET having a gate connected to the input terminal and a source connected to a first source voltage, an NMOSFET having a gate connected to the input terminal and a source connected to a second source voltage, and a plurality of elements serially connected between a drain of the PMOSFET and a drain of the NMOSFET to provide a reduction in a peak transition current of the inverter when half of the first source voltage is output to the output terminal. The plurality of elements may comprise diode-type elements, wherein the diode-type elements comprise PN diodes and/or MOSFETs that act as diodes, wherein each MOSFET has its gate and drain terminals connected to each other. The plurality of elements are used for adjusting the current-voltage characteristic operating points of the inverter when a half of the first source voltage is output to the output terminal of the inverter, based on the connection relationships between the plurality of elements.

In another exemplary embodiment of the invention, a low-power and low-noise CDS comparator comprises a first switch, a first capacitor, a low-power inverter, a second switch, a third switch and a second capacitor. The first switch inputs a reference signal to a first node in response to a first switch control signal. The capacitor is connected between the first node and a second node.

The inverter comprises an input terminal connected to the second node and an output terminal connected to a third node. The inverter further comprises a plurality of elements connected in series between a first source voltage and a second source voltage to invert an input signal applied to the input terminal of the inverter and output an inverted signal to the output terminal of the inverter. The plurality of elements include a first PMOSFET connected to the first source voltage and a first NMOSFET connected to the second source voltage. The input terminal of the inverter is connected to a gate of the first PMOSFET and a gate of the NMOSFET. The plurality of elements further include a plurality of elements connected in series between the first PMOSFET and the first NMOSFET.

The second switch connected between the second node and the third node, wherein the second switch is activated by a second switch control signal to short circuit the second and third nodes.

The third switch inputs a ramp signal to a fourth node, in response to a third switch control signal. The second capacitor is connected between the first and fourth nodes.

In one exemplary embodiment of the CDS comparator, the plurality of elements connected in series between the first PMOSFET and the first NMOSFET of the inverter include a first PN diode and a second PN diode, and wherein the output terminal of the inverter is connected between the first PN diode and the second PN diode.

In another exemplary embodiment of the CDS comparator, the plurality of elements connected in series between the first PMOSFET and the first NMOSFET of the inverter include a second PMOSFET and a second NMOSFET, wherein the output terminal of the inverter is connected to a gate and drain of the second PMOSFET and a gate and drain of the second NMOSFET.

In yet another exemplary embodiment of the CDS comparator, the plurality of elements connected in series between the first PMOSFET and the first NMOSFET of the inverter comprise a second PMOSFET, a third PMOSFET, a second NMOSFET and a third NMOSFET, wherein a drain and gate of the second PMOSFET are connected to each other, wherein a drain and gate of the second NMOSFET are connected to each other, and wherein the output terminal of the inverter is connected to a gate and drain of the third PMOSFET and a gate and drain of the third NMOSFET.

In another exemplary embodiment of the CDS comparator, the plurality of elements connected in series between the first PMOSFET and the first NMOSFET of the inverter comprise a second NMOSFET and a third NMOSFET, wherein a drain and gate of the second NMOSFET are connected to each other, wherein a drain and gate of the third NMOSFET are connected to each other, and wherein the output terminal of the inverter is connected to a source terminal of the third NMOSFET and to the drain and gate of the second NMOSFET.

In yet another exemplary embodiment of the CDS comparator, the plurality of elements connected in series between the first PMOSFET and the first NMOSFET of the inverter comprise a second PMOSFET and a third PMOSFET, wherein a drain and gate of the second PMOSFET are connected to each other, wherein a drain and gate of the third PMOSFET are connected to each other, and wherein the output terminal of the inverter is connected to a source of the third PMOSFET and to the drain and the gate of the second PMOSFET.

In another exemplary embodiment of the CDS comparator, the plurality of elements connected in series between the first PMOSFET and the first NMOSFET of the inverter comprise a second PMOSFET and a second NMOSFET, wherein a drain and gate of the second PMOSFET are connected to each other, wherein a drain and gate of the second NMOSFET are connected to each other, and wherein the output terminal of the inverter is connected to a source of the second PMOSFET and to a source of the second NMOSFET.

In another exemplary embodiment of the CDS comparator, the first switch is a passgate comprising an NMOSFET and a PMOSFET connected in parallel, wherein the first switch control signal comprises complementary signals that are applied to gates of the NMOSFET and PMOSFET of the passgate. Further, the second switch is a passgate comprising an NMOSFET and a PMOSFET connected in parallel, wherein the second switch control signal comprises complementary signals that are applied to gates of the NMOSFET and PMOSFET of the passgate. Moreover, the third switch is a passgate comprising an NMOSFET and a PMOSFET connected in parallel, wherein the second switch control signal comprises complementary signals that are applied to gates of the NMOSFET and PMOSFET of the passgate.

These and other exemplary embodiments, aspects, objects, features and advantages of the present invention will be described or become apparent from the following detailed description of exemplary embodiments thereof, which is to be read in connection with the accompanying drawings.

DETAILED DESCRIPTION OF EXEMPLARY EMBODIMENTS

Figure 1:
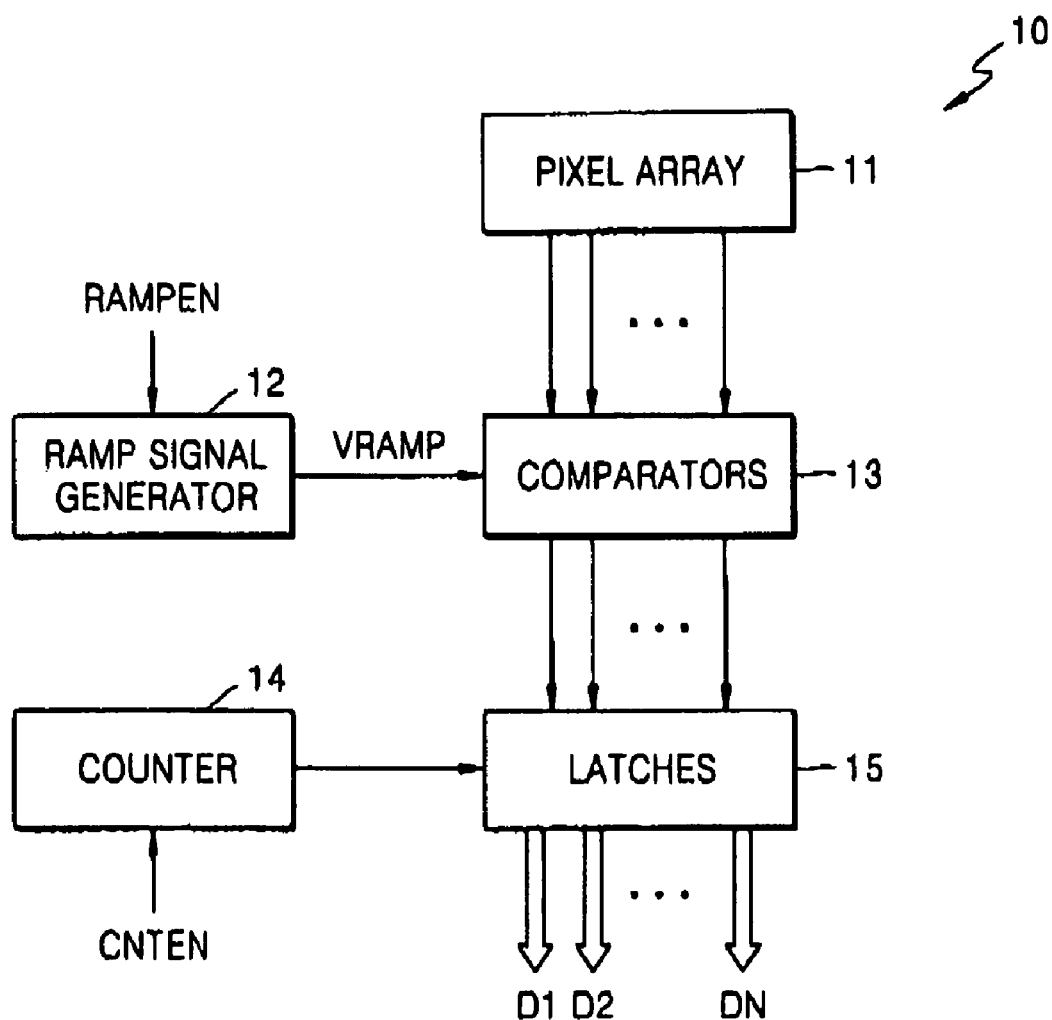
FIG. 1 is a block diagram that illustrates the architecture of a conventional CMOS imaging sensor device, which can implement low-power low-noise CDS comparator circuits according to exemplary embodiments of the invention.
Figure 2:
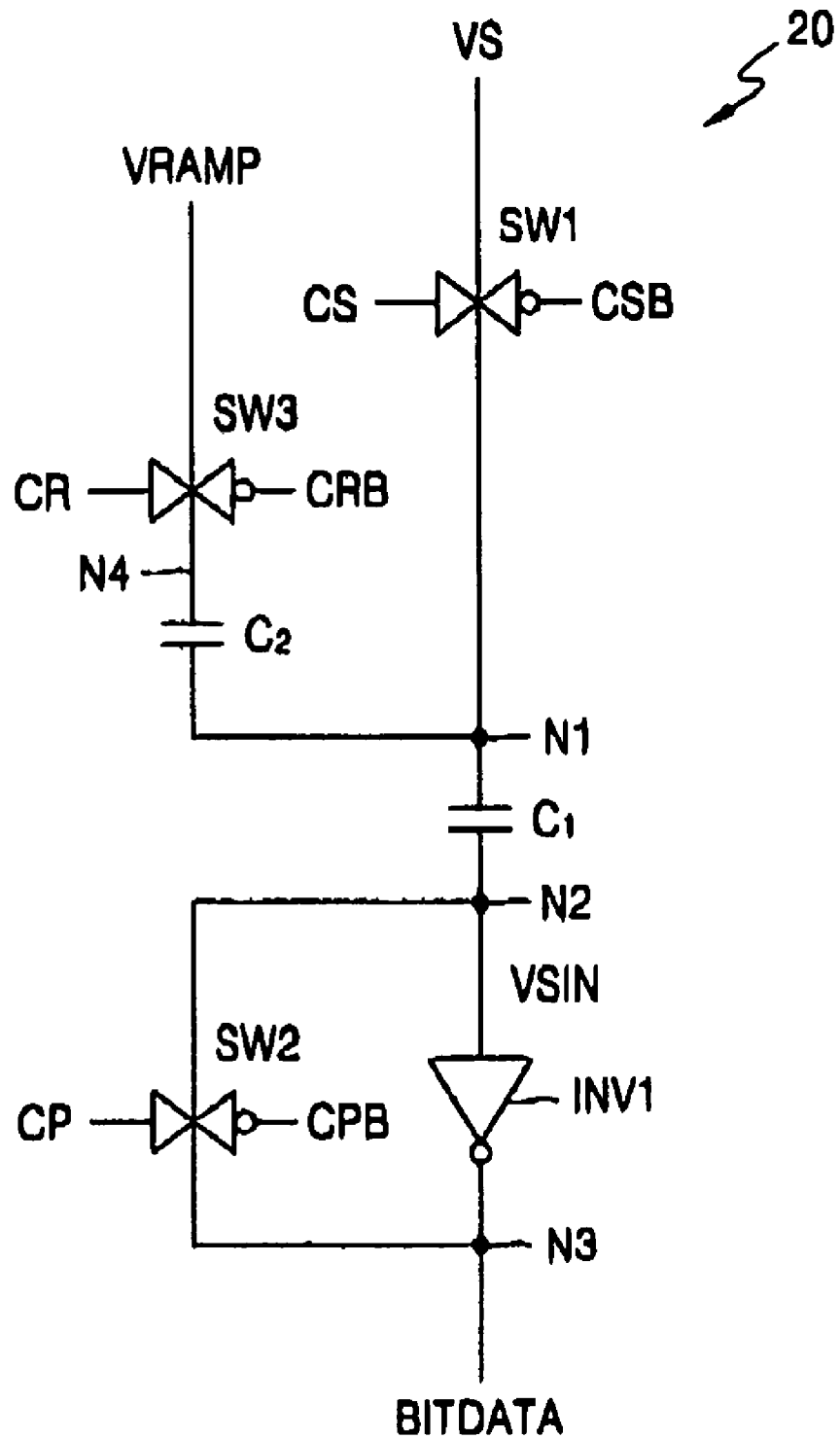
FIG. 2 is a circuit diagram of a low-power and low-noise CDS comparator including a low power inverter according to an embodiment of the present invention.

FIG. 2 is a circuit diagram illustrating a low-power and low-noise CDS comparator circuit according to an exemplary embodiment of the invention, which can be implemented in the CIS device of FIG. 1. More specifically, FIG. 2 illustrates a CDS comparator circuit (20) comprising a low power inverter (INV1) according to an exemplary embodiment of the invention, which is designed to provide reduced peak transition currents to reduce power consumption and noise. Various inverter circuits according to exemplary embodiments of the invention, which can be implemented for the inverter (INV) in the CDS comparator of FIG. 2, will be discussed below with reference to FIGS. 4, 7, 9 and 11–13.

Referring now to FIG. 2, the exemplary low-power and low-noise CDS comparator (20) comprises a first switch (SW1), a first capacitor (C1), a low-power inverter (INV1), a second switch (SW2), a third switch (SW3), and a second capacitor (C2).

The first switch (SW1) is a passgate comprising an NMOSFET and a PMOSFET connected in parallel. The first switch (SW1) is activated/deactivated based on the logic level of control signals CS and CSB (which is the complement of CS) that are applied to the gates of the NMOSFET and the PMOSFET, respectively. The first switch (SW1) is activated to apply a reference signal (VS) to a node N1 connected to the output terminal of the first switch (SW1). The first capacitor (C1) is connected between node N1 (the output terminal of the first switch (SW1)) and node N2 (an input terminal of the inverter (INV1)).

The low-power inverter (INV1) comprises a plurality of elements that are connected in series between a first source voltage VDD and a second source voltage VSS. A signal (VSIN) on node N2, which is input to the input terminal of (INV1) is inverted, and then output via an output terminal of inverter (INV1), which is connected to node (N3). With a low-power inverter (INV1) according to the invention, the voltage-current characteristic operating points when ½ VDD is output to node N3 can be set on the basis of connection relationships between the circuit elements forming the inverter. Again, various exemplary embodiments for the low-power inverter (INV1) are depicted in FIGS. 4, 7, 9 and 1–13, which will be described in detail below.

The second switch (SW2) is connected between nodes N2 and N3 (i.e., connected between the comparison input terminal (input terminal of INV1) and the comparison output terminal (output terminal of INV1)). The second switch (SW2) is activated/deactivated based on the logic states of control signal CP and CPB (which is the complement of CP). The second switch (SW2) is a passgate comprising an NMOSFET and a PMOSFET connected in parallel, wherein the control signals CP and CPB are input to the gates of the NMOSFET and the PMOSFET, respectively. When activated, the second switch (SW1) short-circuits the inverter (INV1).

The third switch (SW3) is activated/deactivated based on the logic states of control signals CR and CRB (which is the complement of CR). The third switch (SW3) is a passgate comprising an NMOSFET and a PMOSFET connected in parallel, wherein the control signals CR and CRB are input to the gates of the NMOSFET and the PMOSFET, respectively. When activated, the third switch (SW3) applies a ramp signal (VRAMP) to node N4, which is connected to the output terminal of the third switch (SW3). The second capacitor (C2) is connected between nodes N4 and N1.

Figure 3:
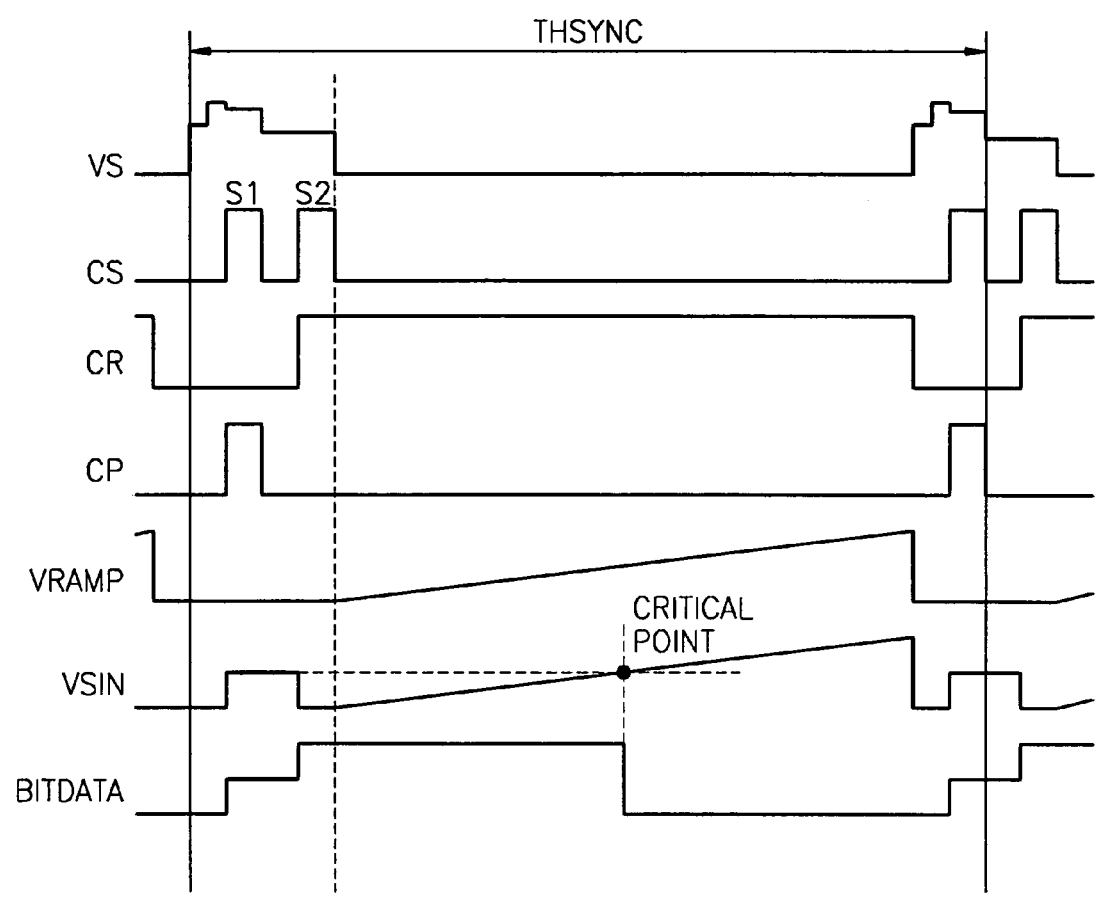
FIG. 3 is an exemplary timing diagram that illustrates an operation of the exemplary low-power and low-noise CDS comparator of FIG. 2.

The operation of a low-power and low-noise CDS comparator as depicted in the exemplary embodiment of FIG. 2 will now be discussed with reference to FIGS. 2 and 3. In particular, FIG. 3 is a timing diagram illustrating various signals that are generated during operation of the CDS comparator circuit (20) of FIG. 2. Referring to FIG. 3, when the first switch (SW1) and the second switch (SW2) are activated at time S1 (switch control signals CS and CP are logic "high"), the first switch (SW1) outputs a reference signal (VS), and the second switch (SW2) short-circuits the nodes N2 and N3. As such, a first sampling voltage is applied to node N1 and the voltage on nodes N2 and N3 become ½ VDD. At that time, the voltage (VSIN) at node N2 (input terminal of INV1) and the voltage (BITDATA) at node N3 (output terminal of INV1) are both ½ VDD. In FIG. 3, the voltage level of VSIN at the "critical point" depicted in FIG. 3 is ½ VDD.

Next, the first switch (SW1) and the second switch (SW2) are both turned off between the time S1 and S2 in FIG. 3 (switch control signals CS and CP are logic "low"). At that time, the voltage at node N1 is maintained at the first sampling voltage level, and the voltage at node N2 (VSIN) and the voltage at node N3 (BITDATA) are held at the level of ½ VDD.

Then, at position S2, the first switch (SW1) is activated (CS is logic "high") to allow the voltage at node N1 to become a second sampling voltage. For example, in a case of a mobile phone camera or a digital camera employing a CIS, the reference signal (VS) is a voltage that is generated by (and output from) the CIS, the first sampling voltage is an initial reference voltage for the CDS, and the second sampling voltage is a voltage which is generated by converting an external image substantially photographed by the CIS, and which is decreased by an active signal voltage from the first sampling voltage. At this time, the voltage (VSIN) at node N2 (input terminal of INV1) is decreased by the active signal voltage, and the voltage (BITDATA) at node N3 (output terminal of INV1) is increased by the active signal voltage.

Accordingly, after the above CDS operation is performed, the third switch (SW3) is activated (switch control signal CR is logic "high") to input the ramp signal (VRAMP), and the voltage (VSIN) at node N2 (which has been decreased by the active signal voltage) is gradually increased in accordance with the second sampling voltage input from the CIS. When the voltage (VSIN) at node N2 (input terminal of INV1) exceeds the logic threshold voltage (½ VDD), the voltage (BITDATA) at node N3 (output terminal of INV1) turns to logic "low". The digital value BITDATA output from the low-power inverter (NV1) is sent to a corresponding column latch in the latches circuit (150) of FIG. 1, the counter (140) outputs a count value corresponding to the digital value, and the latches (150) thus store and output a digital signal proportional to the analog signal (second sampling voltage) sensed and output from the pixel array (110).

Figure 4:
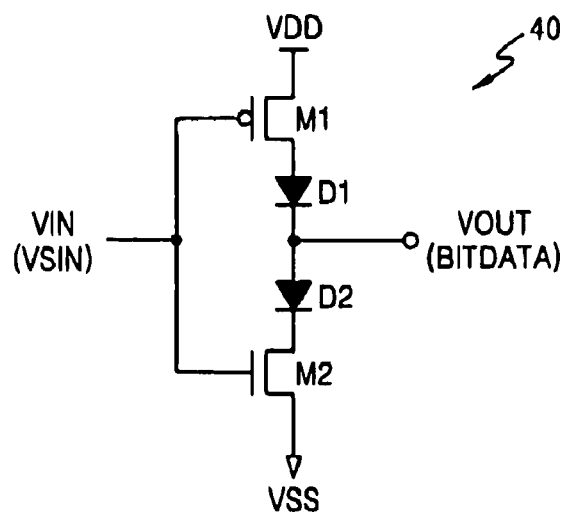
FIG. 4 is a circuit diagram that illustrates a low-power inverter according to an exemplary embodiment of the invention, which can be implemented in the exemplary low-power and low-noise CDS comparator of FIG. 2.

Referring now to FIG. 4, a circuit diagram illustrates a low-power inverter (40) according to an exemplary embodiment of the invention, which can be implemented for the inverter (INV1) in FIG. 2. The exemplary low-power inverter (40) comprises a PMOSFET (M1), a first PN diode (D1), a second PN diode (D2) and an NMOSFET (M2) connected in series between a first source voltage VDD and a second source voltage VSS. The gates of the PMOSFET (M1) and the NMOSFET (M2) are connected to the input terminal VIN of the inverter (40) (which corresponds to VSIN or the input terminal of INV1 (node N2) in FIG. 2) and the node between the first PN diode (D1) and the second PN diode (D2) is connected to the output terminal VOUT of the inverter (40) (which corresponds to BITDATA or the output terminal (node N3) of the INV1 in FIG. 2).

Figure 5:
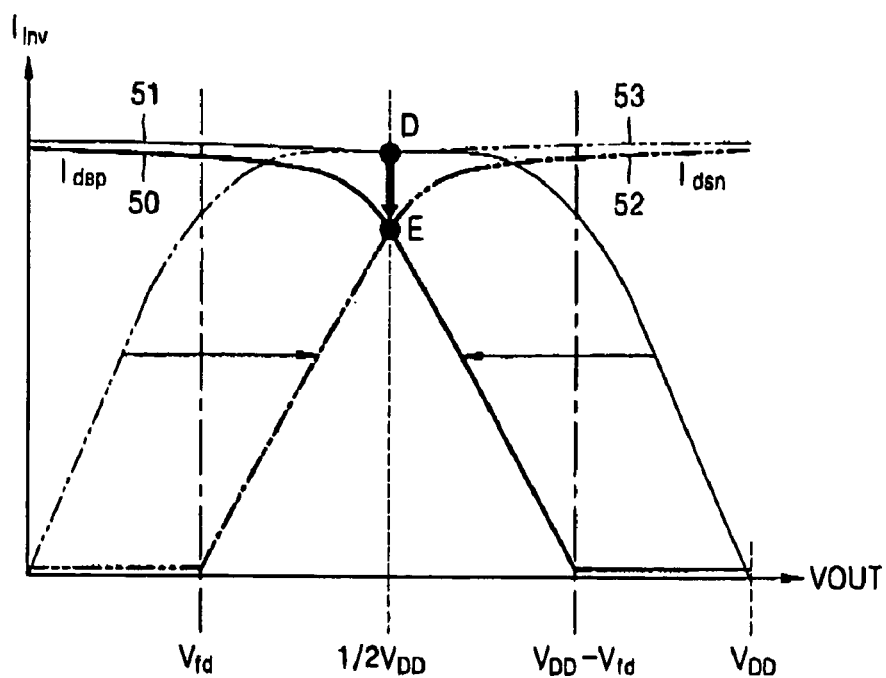
FIG. 5 is a graphical illustration comparing I–V characteristics of the exemplary inverter of FIG. 4 with the conventional inverter of FIG. 14.
Figure 14:
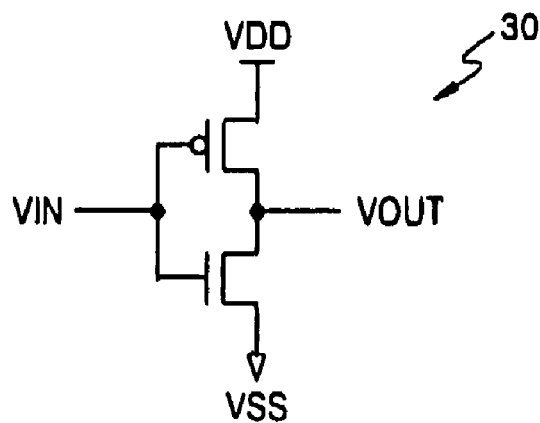
FIG. 14 is a circuit diagram that illustrates a conventional inverter consisting of only two MOSFET devices.

FIG. 5 is a graphical illustration comparing I–V characteristics of the inverter (40) with that of the conventional inverter (30) shown in FIG. 14. In FIG. 5, the axis which is labelled $I_{inv}$ represents a current flowing between the first source voltage VDD and the second source voltage VSS, and the axis labelled VOUT represents inverter output voltage. $V_{fd}$ is a turn-on voltage of the first PN diode (D1) and the second PN diode (D2).

In FIG. 5, the line (50) represents a current characteristic $I_{dsp}$ of the inverter (40) due to M1 and D1 when VIN is ½ VDD, and the line (52) represents a current characteristic $I_{dsn}$ of the inverter (40) due to M2 and D2 when VIN is ½ VDD. The line (51) represents a current characteristic $I_{dsp}$ of the conventional inverter (30) due to M1 when VIN is ½ VDD, and the line (53) represents the current characteristic $I_{dsn}$ of the conventional inverter (30) due to M2 when VIN is ½ VDD.

As depicted in FIG. 5, assuming ½ VDD is output to the output terminal VOUT of the inverters (30) and (40), the current-voltage characteristic operating point (E) of the low-power inverter (40) is lower than an operating point (D) of the conventional inverter (30). Therefore, if the current-voltage characteristic operating point (when ½ VDD is output) is changed from D to E, the peak current generated in conventional inverter (30) is eliminated.

Figure 6A:
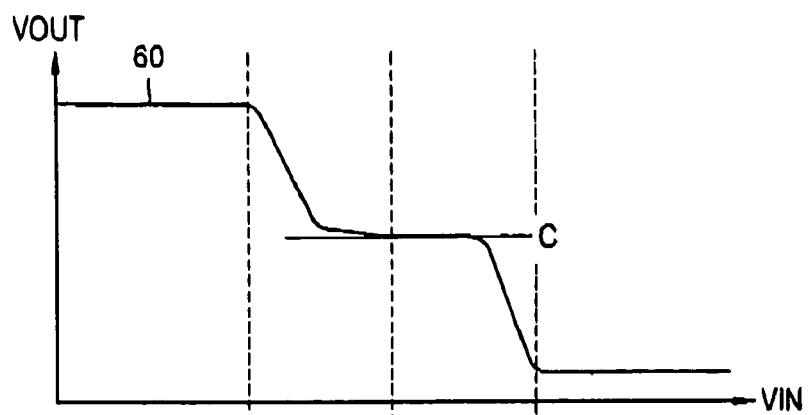
FIGS. 6A and 6B generally illustrate a reduction in the peak current when an input voltage of VDD/2 is input to a low-power inverter according to the invention, wherein FIG. 6A graphically illustrates the VOUT-VIN characteristics of an exemplary inverter according to the invention and FIG. 6B graphically illustrates the inverter current (Iinv)-VIN characteristics of an exemplary inverter according to the invention.
Figure 6B:
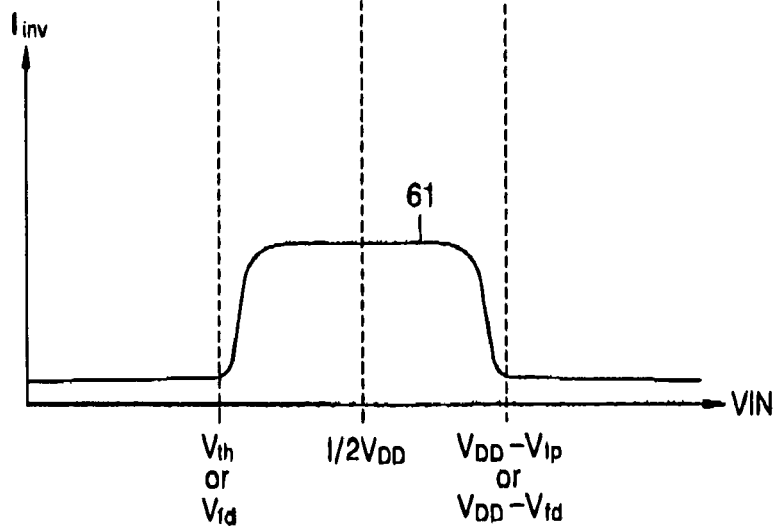

FIG. 6A graphically illustrates the VOUT-VIN characteristics of the exemplary inverter (40) of FIG. 4 and FIG. 6B graphically illustrates the inverter current (Iinv)-VIN characteristics of the inverter (40). FIG. 6A illustrates point C along voltage curve (61) which represents the logic threshold voltage (½ VDD). As depicted in FIG. 6B, a current curve (61) depicts a smooth and decreased transition current which contributes to reduced power consumption.

Figure 7:
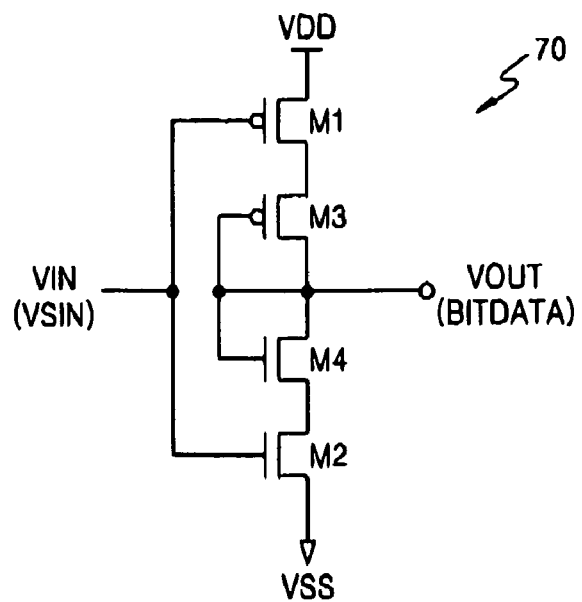
FIG. 7 is a circuit diagram that illustrates a low-power inverter according to another exemplary embodiment of the invention, which can be implemented in the exemplary low-power and low-noise CDS comparator of FIG. 2.

Referring now to FIG. 7, a circuit diagram illustrates a low-power inverter (70) according to another exemplary embodiment of the present invention, which can be implemented as the inverter (INV1) in the CDS comparator (20) of FIG. 2. The low-power inverter (70) comprises four MOSFETS (M1~M4) connected in series between the first source voltage VDD and the second source voltage VSS, wherein MOSFETS (M1) and (M3) are PMOSFETS and MOSFETS (M2) and (M4) are NMOSFETS. The gates of the PMOSFET (M1) and the NMOSFET (M2) are connected to the input terminal VIN (which corresponds to VSIN or the input terminal of INV1 (node N2) in FIG. 2) and the gates of the PMOSFET (M3) and NMOSFET (M4) and a node between the drain of the PMOSFET (M3) and the drain of the NMOSFET (M4) are connected to the output terminal VOUT (which corresponds to BITDATA or the output terminal of INV1 (node N3) in FIG. 2).

Figure 8:
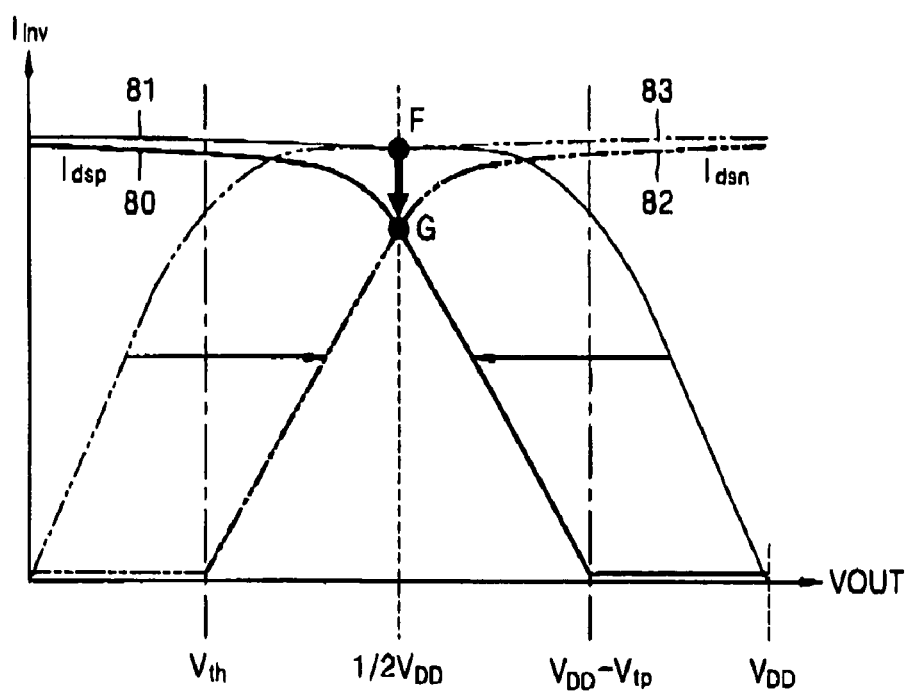
FIG. 8 is a graphical illustration comparing I–V characteristics of the exemplary inverter of FIG. 7 with the conventional inverter of FIG. 14.

FIG. 8 is a graphical illustration comparing I–V characteristics of the inverter (70) with that of the conventional inverter (30) shown in FIG. 14. In FIG. 8, the axis which is labelled $I_{inv}$ represents a current flowing between the first source voltage VDD and the second source voltage VSS, and the axis labelled VOUT represents inverter output voltage. $V_{tp}$ is a threshold voltage of the PMOSFET (M3), and $V_{tn}$ is a threshold voltage of the NMOSFET (M4).

In FIG. 8, the line (80) represents a current characteristic $I_{dsp}$ of the inverter (70) due to M1 and M3 when VIN is ½ VDD, and the line (82) represents the current characteristic $I_{dsn}$ of the inverter (70) due to M4 and M2 when VIN is ½ VDD. The line (81) represents a current characteristic $I_{dsp}$ of the conventional inverter (30) due to M1 when VIN is ½ VDD, and the line (83) represents the current characteristic $I_{dsn}$ of the conventional inverter (30) due to M2 when VIN is ½ VDD.

As depicted in FIG. 8, assuming the output voltage VOUT of the inverters (30) and (70) is ½ VDD, a current-voltage characteristic operating point (G) of the low-power inverter (70) is lower than an operating point (F) of the conventional inverter (30). Therefore, if the current-voltage characteristic operating point when ½ VDD is output is changed from F to G, the peak current generated in conventional inverter (30) is eliminated. Again, as discussed above with reference to FIGS. 6A and 6B, at a point C representing the logic threshold voltage (½ VDD), a smooth and decreased transition current appears to contribute to the decrease in power.

Figure 9:
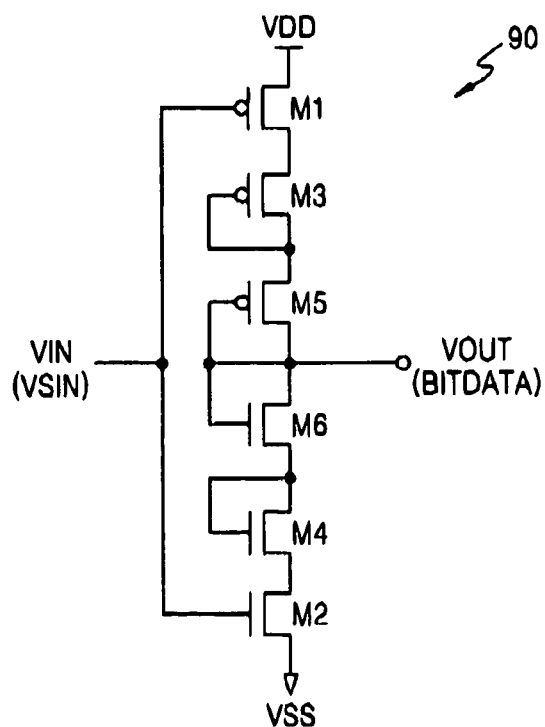
FIG. 9 is a circuit diagram that illustrates a low-power inverter according to an exemplary embodiment of the invention, which can be implemented in the exemplary low-power and low-noise CDS comparator of FIG. 2.

Referring now to FIG. 9, a circuit diagram illustrates a low-power inverter (90) according to another exemplary embodiment of the invention, which can be implemented as the inverter (INV1) in FIG. 2. The low-power inverter (90) comprises six MOSFETS (M1~M6) connected in series between the first source voltage VDD and the second source voltage VSS, wherein MOSFETS (M1), (M3) and (M5) are PMOSFETS and wherein MOSFETS (M2), (M4) and (M6) are NMOSFETS. The drain and the gate of PMOSFET (M3) are connected to each other, the drain and the gate of NMOSFET (M4) are connected to each other, the gates of the PMOSFET (M1) and the NMOSFET (M2) are connected to the input terminal VIN (which corresponds to VSIN or the input terminal of INV1 (node N2) in FIG. 2). Further, the gate of the PMOSFET (M5), the gate of the NMOSFET (M6) and a node between the drain of the PMOSFET (M5) and the drain of the NMOSFET (M6) are connected to the output terminal VOUT (which corresponds to BITDATA or the output terminal of INV1 (node N3) of FIG. 2).

Figure 10:
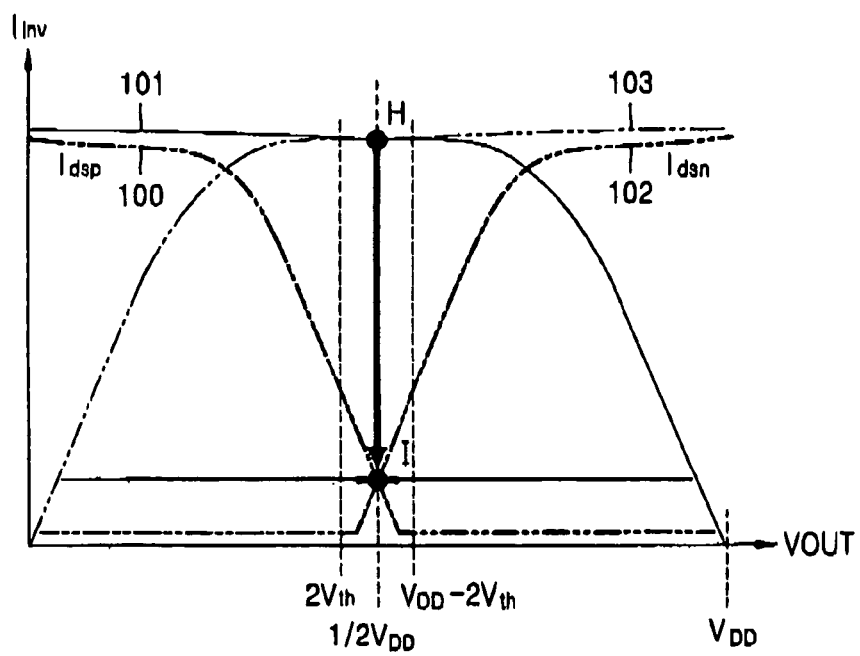
FIG. 10 is a graphical illustration comparing I–V characteristics of the exemplary inverter of FIG. 9 with the conventional inverter of FIG. 14.

FIG. 10 is a graphical illustration comparing I–V characteristics of the inverter (90) with that of the conventional inverter (30) shown in FIG. 14. In FIG. 10, the axis which is labelled $I_{inv}$ represents a current flowing between the first source voltage VDD and the second source voltage VSS, and the axis labelled VOUT represents inverter output voltage. $V_{th}$ is a sum of threshold voltages of the PMOSFET (M3) and the PMOSFET (M5), or a sum of threshold voltages of the NMOSFET (M6) and the NMOSFET (M4).

In FIG. 10, the line (100) represents a current characteristic $I_{dsp}$ of the inverter (90) due to M1, M3 and M5 when VIN is ½VDD, and the line (102) represents the current characteristic $I_{dsn}$ of the inverter (90) due to M2, M4 and M6 when VIN is ½VDD. The line (101) represents a current characteristic $I_{dsp}$ of the conventional inverter (30) due to M1 when VIN is ½VDD, and the line (103) represents the current characteristic $I_{dsn}$ of the conventional inverter (30) due to M2 when VIN is ½VDD.

As depicted in FIG. 10, assuming the output voltage VOUT of the inverters (30) and (90) is ½ VDD, a current-voltage characteristic operating point (I) of the low-power inverter (90) is lower than an operating point (H) of the conventional inverter (30). Therefore, if the current-voltage characteristic operating point when ½VDD is output is changed from H to I, the peak current generated in conventional inverter (30) is eliminated. Again, as discussed above with reference to FIGS. 6A and 6B, at a point C representing the logic threshold voltage (½VDD), a smooth and decreased transition current appears to contribute to the decrease of power.

Figure 11:
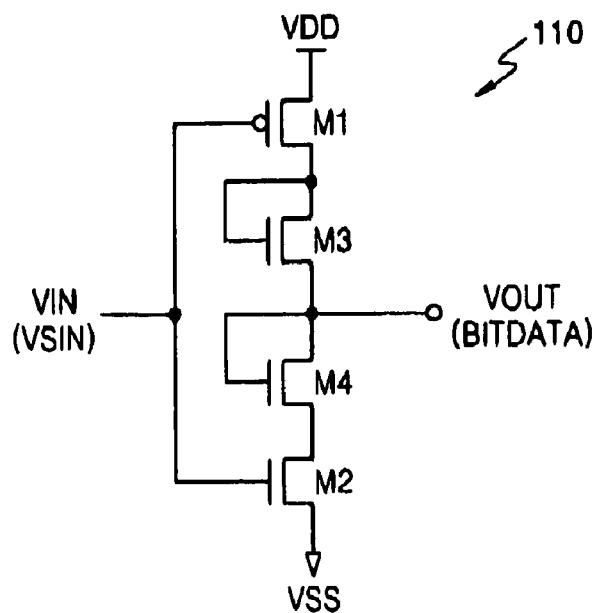
FIG. 11 is a circuit diagram that illustrates a low-power inverter according to an exemplary embodiment of the invention, which can be implemented in the exemplary low-power and low-noise CDS comparator of FIG. 2.
Figure 12:
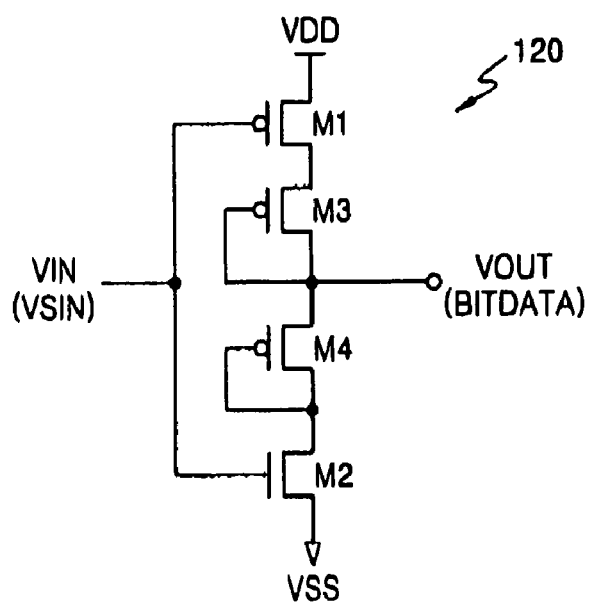
FIG. 12 is a circuit diagram that illustrates a low-power inverter according to an exemplary embodiment of the invention, which can be implemented in the exemplary low-power and low-noise CDS comparator of FIG. 2.
Figure 13:
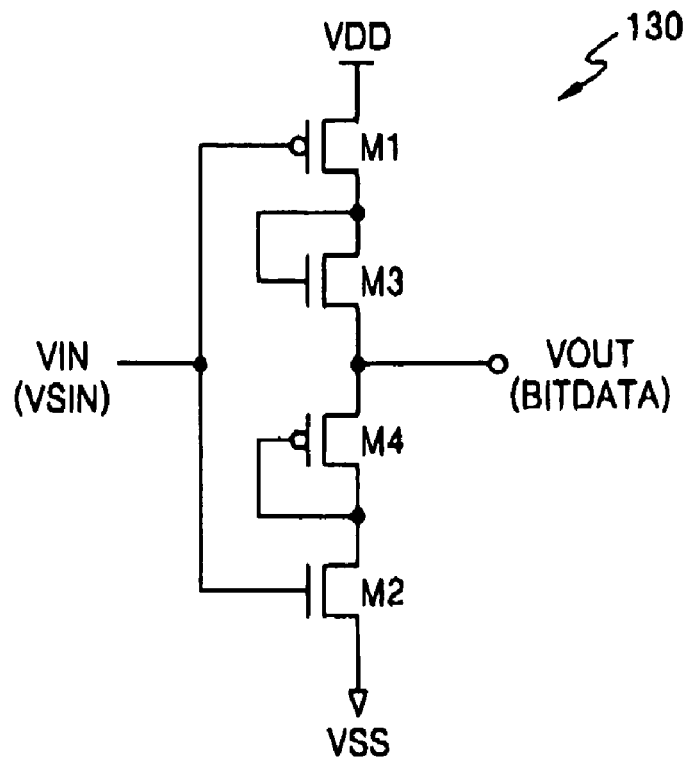
FIG. 13 is a circuit diagram that illustrates a low-power inverter according to an exemplary embodiment of the invention, which can be implemented in the exemplary low-power and low-noise CDS comparator of FIG. 2.

FIGS. 11, 12 and 13 are circuit diagrams illustrating low-power inverters according to other exemplary embodiments of the invention, which can be implemented as the inverter INV1 shown in FIG. 2.

Referring to FIG. 11, a low-power inverter (110) comprises a PMOSFET M1 and three NMOSFETS (M2~M4) connected in series between the first source voltage VDD and the second source voltage VSS. In FIG. 11, the drain and the gate of the NMOSFET (M3) are connected to each other, the drain and the gate of the NMOSFET (M4) are connected to each other, the gates of the PMOSFET (M1) and the NMOSFET (M2) are connected to the input terminal (VIN) (which corresponds to VSIN or the input terminal of INV1 (node N2) in FIG. 2). Further, a node between the source of the NMOSFET (M3) and the drain of the NMOSFET (M4) is connected to the output terminal VOUT (which corresponds to BITDATA or the output terminal of INV1 (node N3) in FIG. 2).

Referring to FIG. 12, a low-power inverter (120) comprises three PMOSFETS (M1), (M3) and (M4) and an NMOSFET (M2) connected in series between the first source voltage VDD and the second source voltage VSS. The drain and the gate of the PMOSFET (M3) are connected to each other, the drain and the gate of the PMOSFET (M4) are connected to each other, the gates of the PMOSFET (M1) and the NMOSFET (M2) are connected to the input terminal (VIN) (which corresponds to VSIN or the input terminal of INV1 (node N2) in FIG. 2). Further, a node between the drain of the PMOSFET (M3) and the source of the PMOSFET (M4) is connected to the output terminal (VOUT) (which corresponds to BITDATA or the output terminal of INV1 (node N3) in FIG. 2).

Referring to FIG. 13, a low-power inverter (130) comprises PMOSFETS (M1) and (M4) and NMOSFETs (M2) and (M3), which are connected in series between the first source voltage VDD and the second source voltage VSS. The drain and the gate of the NMOSFET (M3) are connected to each other, the drain and the gate of the PMOSFET (M4) are connected to each other, the gates of the PMOSFET (M1) and the NMOSFET (M2) are connected to the input terminal (VIN) (which corresponds to VSIN or the input terminal of INV1 (node N2) in FIG. 2). Further, a node between the source of the NMOSFET (M3) and the source of the PMOSFET (M4) is connected to the output terminal (VOUT) (which corresponds to BITDATA or the output terminal of INV1 (node N3) in FIG. 2).

As with the exemplary embodiments described above with reference to FIGS. 5, 8 and 10, when the low-power inverters (110), (120) or (130) are implemented for the inverter (INV1) in the CDS comparator of FIG. 2, when ½VDD is output from VOUT (output terminal of INV1), the current-voltage characteristic operating point of the low-power inverters (110), (120) and (130) is lower than an operating point of the conventional inverter (30) of FIG. 14. Therefore, the peak current generated by the conventional inverter (30) is removed, and as shown in FIG. 6, at the point C representing the logic threshold voltage (½VDD), a smooth and decreased transition current appears to contribute to reduced power consumption.

As described above, a low-power and low-noise comparator according to an exemplary embodiment of the present invention comprises a low-power inverter having a plurality of elements connected in series between the first source voltage VDD and the second source voltage VSS, and operates to invert an input signal (input terminal of INV1) and output an inverted signal (output terminal of INV1). With a low-power inverter according to the invention, the voltage-current characteristic operating points when ½VDD is output (to output terminal of INV1) are set on the basis of the connection relations between the plurality of elements, such that the current consumption is lower than that in the conventional inverter structure. As a result, a smooth and decreased transition current appears at the logic threshold voltage (½VDD) to contribute to reduced power consumption.

As described above, a comparator according to an exemplary embodiment of the present invention comprises a low power inverter which includes additional diodes or MOSFETs so as to decrease an instantaneous transition current at a logic threshold voltage. Therefore, when used in the comparator array of a CIS, the inverters can collectively contribute to a large significant reduction in power and noise of the CIS.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A CDS (correlated double sampling) comparator, comprising:
    a first switch that inputs a reference signal to a first node in response to a first switch control signal;
    a first capacitor connected between the first node and a second node;
    an inverter having an input terminal connected to the second node and an output terminal connected to a third node, wherein the inverter comprises a plurality of elements connected in series between a first source voltage and a second source voltage to invert an input signal applied to the input terminal of the inverter and output an inverted signal to the output terminal of the inverter, wherein the plurality of elements include a first PMOSFET connected to the first source voltage and a first NMOSFET connected to the second source voltage, wherein the input terminal of the inverter is connected to a gate of the first PMOSFET and a gate of the NMOSFET, and wherein the plurality of elements further include a plurality of elements connected in series between the first PMOSFET and the first NMOSFET;
    a second switch connected between the second node and the third node, wherein the second switch is activated by a second switch control signal to short circuit the second and third nodes,
    a third switch that inputs a ramp signal to a fourth node, in response to a third switch control signal; and
    a second capacitor connected between the first and fourth nodes.

2. The CDS comparator of claim 1, wherein the plurality of elements connected in series between the first PMOSFET and the first NMOSFET include a first PN diode and a second PN diode, and wherein the output terminal of the inverter is connected between the first PN diode and the second PN diode.

3. The CDS comparator of claim 1, wherein the plurality of elements connected in series between the first PMOSFET and the first NMOSFET include a second PMOSFET and a second NMOSFET, wherein the output terminal of the inverter is connected to a gate and drain of the second PMOSFET and a gate and drain of the second NMOSFET.

4. The CDS comparator of claim 1, wherein the plurality of elements connected in series between the first PMOSFET and the first NMOSFET comprise a second PMOSFET, a third PMOSFET, a second NMOSFET and a third NMOSFET, wherein a drain and gate of the second PMOSFET are connected to each other, wherein a drain and gate of the second NMOSFET are connected to each other, and wherein the output terminal of the inverter is connected to a gate and drain of the third PMOSFET and a gate and drain of the third NMOSFET.

5. The CDS comparator according to claim 1, wherein the plurality of elements connected in series between the first PMOSFET and the first NMOSFET comprise a second NMOSFET and a third NMOSFET, wherein a drain and gate of the second NMOSFET are connected to each other, wherein a drain and gate of the third NMOSFET are connected to each other, and wherein the output terminal of the inverter is connected to a source terminal of the third NMOSFET and to the drain and gate of the second NMOSFET.

6. The CDS comparator of claim 1, wherein the plurality of elements connected in series between the first PMOSFET and the first NMOSFET comprise a second PMOSFET and a third PMOSFET, wherein a drain and gate of the second PMOSFET are connected to each other, wherein a drain and gate of the third PMOSFET are connected to each other, and wherein the output terminal of the inverter is connected to a source of the third PMOSFET and to the drain and the gate of the second PMOSFET.

7. The CDS comparator of claim 1, wherein the plurality of elements connected in series between the first PMOSFET and the first NMOSFET comprise a second PMOSFET and a second NMOSFET, wherein a drain and gate of the second PMOSFET are connected to each other, wherein a drain and gate of the second NMOSFET are connected to each other, and wherein the output terminal of the inverter is connected to a source of the second PMOSFET and to a source of the second NMOSFET.

8. The CDS comparator of claim 1, wherein the first switch is a passgate comprising an NMOSFET and a PMOSFET connected in parallel, wherein the first switch control signal comprises complementary signals that are applied to gates of the NMOSFET and PMOSFET of the passgate.

9. The CDS comparator of claim 1, wherein the second switch is a passgate comprising an NMOSFET and a PMOSFET connected in parallel, wherein the second switch control signal comprises complementary signals that are applied to gates of the NMOSFET and PMOSFET of the passgate.

10. The CDS comparator of claim 1, wherein the third switch is a passgate comprising an NMOSFET and a PMOSFET connected in parallel, wherein the second switch control signal comprises complementary signals that are applied to gates of the NMOSFET and PMOSFET of the passgate.

* * * * *